United States Patent
Joo et al.

(10) Patent No.: US 8,218,375 B2
(45) Date of Patent: Jul. 10, 2012

(54) OSCILLATION CIRCUITS HAVING TEMPERATURE-DEPENDENT FREQUENCY GENERATION AND SEMICONDUCTOR MEMORY DEVICES HAVING TEMPERATURE-DEPENDENT SELF REFRESH RATE

(75) Inventors: Jong-Doo Joo, Gyeonggi-do (KR); Cheol-Ha Lee, Gyeonggi-do (KR); Sang-Seok Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 325 days.

(21) Appl. No.: 12/689,502

(22) Filed: Jan. 19, 2010

(65) Prior Publication Data

US 2010/0182852 A1 Jul. 22, 2010

(30) Foreign Application Priority Data

Jan. 19, 2009 (KR) .................. 10-2009-0004051

(51) Int. Cl.
*G11C 5/143* (2006.01)
*G03K 3/03* (2006.01)
(52) U.S. Cl. .............. 365/189.09; 365/222; 365/211
(58) Field of Classification Search .......... 365/211
See application file for complete search history.

(56) References Cited

U.S. PATENT DOCUMENTS

| | | | | |
|---|---|---|---|---|
| 3,970,966 A | * | 7/1976 | Keller et al. | 331/116 R |
| 4,051,446 A | * | 9/1977 | Owaki | 331/116 R |
| 4,254,382 A | * | 3/1981 | Keller et al. | 331/116 R |
| 4,302,731 A | * | 11/1981 | Ashida | 331/116 R |
| 4,406,013 A | * | 9/1983 | Reese et al. | 377/29 |
| 5,532,968 A | * | 7/1996 | Lee | 365/222 |
| 5,801,982 A | * | 9/1998 | Blodgett | 365/149 |
| 6,560,164 B2 | * | 5/2003 | Kawai et al. | 365/233.1 |
| 6,597,614 B2 | * | 7/2003 | Nam et al. | 365/222 |
| 7,038,967 B2 | * | 5/2006 | Uchikoba et al. | 365/222 |
| 7,075,847 B2 | * | 7/2006 | Kim et al. | 365/222 |
| 7,936,227 B2 | * | 5/2011 | Young | 331/158 |
| 7,982,551 B2 | * | 7/2011 | Iwaida et al. | 331/176 |

FOREIGN PATENT DOCUMENTS

| | | |
|---|---|---|
| JP | 2005-222574 | 8/2005 |
| KR | 10-0165755 | 9/1998 |
| KR | 10-0520580 | 9/2005 |

* cited by examiner

*Primary Examiner* — Tan T. Nguyen
(74) *Attorney, Agent, or Firm* — Myers Bigel Sibley & Sajovec, P.A.

(57) ABSTRACT

An oscillation circuit includes an internal voltage generator and an oscillator. The internal voltage generator receives an external voltage and generates an internal voltage based on the external voltage. The internal voltage varies in linearly with an operational temperature. The oscillator generates a variable oscillation signal based on the internal voltage. A period of the variable oscillation signal varies in linearly with the operational temperature.

14 Claims, 9 Drawing Sheets

| TEMP(°C) | OPERATING CURRENT1 (mA) | OPERATING CURRENT2 (μA) | STANDBY CURRENT(μA) | SELF REFRESH CURRENT(μA) |
|---|---|---|---|---|
| -55 | 20 | 6.144 | 40(12) | 46.144 |
| 25 |  | 49.152 | 50(15) | 99.152 |
| 125 |  | 122.88 | 70(20) | 192.88 |

OSCILLATION CIRCUITS HAVING TEMPERATURE-DEPENDENT FREQUENCY GENERATION AND SEMICONDUCTOR MEMORY DEVICES HAVING TEMPERATURE-DEPENDENT SELF REFRESH RATE

REFERENCE TO RELATED APPLICATION

This application claims priority to Korean Patent Application No. 2009-0004051, filed Jan. 19, 2009, the contents of which are hereby incorporated herein by reference.

FIELD OF THE INVENTION

The present invention is related to integrated circuit devices and, more particularly, to temperature compensation circuits.

BACKGROUND

Semiconductor memory devices may be classified into volatile memory devices and non-volatile memory devices according to whether stored information is retained when power to the semiconductor memory devices is off. The volatile memory devices such as a dynamic random access memory (DRAM) may be refreshed by sensing stored data and recharging sensed data to memory cells through bit lines. As operational temperature of the semiconductor memory device becomes higher, leakage current in the memory cell increases, and thus data retention time and refresh period may decrease.

SUMMARY

Example embodiments provide an oscillation circuit for generating a variable oscillation signal based on a reference voltage such that a period of the oscillation signal may vary in linearly with an operational temperature.

Example embodiments provide a semiconductor memory system including an oscillation circuit for generating the variable oscillation signal.

In some example embodiments, an integrated circuit device includes a voltage generator and an oscillator. The integrated circuit device generates a first voltage having a magnitude that varies linearly across a first voltage range in response to changes in an operating temperature of the voltage generator. The oscillator generates a periodic signal having a frequency that varies linearly across a first frequency range in response to changes in the first voltage.

The voltage generator may include an amplifier. The amplifier may generate the first voltage in response to a reference voltage having a magnitude that varies linearly across a second voltage range in response to the changes in the operating temperature. For example, the first and second voltage ranges are unequal. The voltage generator may further include a reference voltage generator. The reference voltage generator may generate the reference voltage and a bias voltage having a magnitude that is fixed relative to the changes in the operating temperature.

In some example embodiments, an integrated circuit device includes an array of memory cells and a self-refresh control circuit. The self-refresh control circuit refreshes memory cells in the array at a refresh frequency that varies across a first frequency range in response to changes in an operating temperature of the array. The control circuit may generate a refresh address having a value that changes at the refresh frequency.

The self-refresh control circuit may include a voltage generator and an oscillator. The voltage generator may generate a first voltage having a magnitude that varies linearly across a first voltage range in response to the changes in the operating temperature. The oscillator may generate a periodic signal having a frequency that varies linearly across a first frequency range in response to the changes in the operating temperature. The oscillator may be responsive to the first voltage. The voltage generator may include an amplifier. The amplifier may generate the first voltage in response to a reference voltage having a magnitude that varies linearly across a second voltage range in response to the changes in the operating temperature. The first and second voltage ranges may be unequal.

The voltage generator may further include a reference voltage generator which generates the reference voltage and a bias voltage. The bias voltage may have a magnitude that is fixed relative to the changes in the operating temperature. The reference voltage generator may vary the magnitude of the reference voltage relative to the bias voltage.

In some example embodiments, an oscillation circuit includes an internal voltage generator and an oscillator. The internal voltage generator receives an external voltage and generates an internal voltage based on the external voltage. The internal voltage varies in linearly with the operational temperature. The oscillator generates a variable oscillation signal based on the internal voltage. A period of the variable oscillation signal varies in linearly with the operational temperature.

The internal voltage generator may include a reference voltage generator and an amplification circuit. The reference voltage generator may generate a reference voltage based on the external voltage. The reference voltage may vary in linearly with the operational temperature. The amplification circuit may amplify the reference voltage to generate the internal voltage. The reference voltage generator may generate a bias voltage which has a fixed value regardless of the temperature and generate the reference voltage based on the bias voltage.

For example, the reference voltage generator may include a first n-type metal oxide semiconductor (NMOS) transistor, a second NMOS transistor, a first resistor, a second resistor, a p-type metal oxide semiconductor (PMOS) transistor, a third NMOS transistor, and a third resistor. The first NMOS transistor may include a gate receiving the external voltage and a source connected to a ground voltage, and the second NMOS transistor may include a gate connected to a first node to which the bias voltage applied and a source connected to a drain of the first NMOS transistor. The first resistor may be connected between the external voltage and the first node, and the second resistor may be connected between the first node and a drain of the second NMOS transistor. The PMOS transistor may include a gate connected to the drain of the second NMOS transistor, a source connected to the ground voltage, and a drain connected to the first node. The third NMOS transistor may include a gate and a drain connected to the first node in common such that the third NMOS transistor may be a diode-coupled transistor. The third resistor may be connected between a source of the third NMOS transistor and the ground voltage. The reference voltage may correspond to a voltage of the source of the third NMOS transistor.

In some example embodiments, the oscillator may be a ring oscillator driven by the internal voltage.

The oscillator may include an odd number of NMOS transistors and a ring oscillator. The odd number of NMOS transistors may respectively include a gate and a drain receiving the internal voltage, the gate and the drain being connected with each other. The ring oscillator may include odd number of inverters coupled in series, and the inverters are respectively connected between sources of the NMOS transistors and a ground voltage.

In some example embodiments, a semiconductor memory device includes an interface unit, a control unit, a self refresh unit, and a memory cell array. The interface unit converts a command signal to an internal control signal. The control unit generates an oscillation control signal and a memory control signal based on the internal control signal. The self refresh unit generates an internal voltage in response to the oscillation control signal, generates a variable oscillation signal based on the internal voltage, and provides a refresh address and a refresh control signal based on the variable oscillation signal. The internal voltage may vary in linearly with the operational temperature. The memory cell array includes a plurality of memory cells refreshed based on the memory control signal, the refresh address, and the refresh control signal.

The self refresh unit may include a reference voltage generator, an amplification circuit, and an oscillator. The reference voltage generator may generate a reference voltage based on an external voltage. The reference voltage varies in linearly with the operational temperature. The amplification circuit may amplify the reference voltage to generate an internal voltage. The oscillator may generate a variable oscillation signal based on the internal voltage. A period of the variable oscillation signal varies in linearly with the operational temperature. The reference voltage generator may generate a bias voltage having a fixed value regardless of the external voltage and generates the reference voltage based on the bias voltage. The reference voltage generator may include a first NMOS transistor, a second NMOS transistor, a first resistor, a second resistor, a PMOS transistor, a third NMOS transistor, and a third resistor. The first NMOS transistor may include a gate receiving the external voltage and a source connected to a ground voltage, and the second NMOS transistor may include a gate connected to a first node to which the bias voltage applied and a source connected to a drain of the first NMOS transistor. The first resistor may be connected between the external voltage and the first node, and the second resistor may be connected between the first node and a drain of the second NMOS transistor. The PMOS transistor may include a gate connected to the drain of the second NMOS transistor, a source connected to the ground voltage, and a drain connected to the first node. The third NMOS transistor may include a gate and a drain connected to the first node in common such that the third NMOS transistor may be a diode-coupled transistor. The third resistor may be connected between a source of the third NMOS transistor and the ground voltage. The reference voltage may correspond to a voltage of the source of the third NMOS transistor.

DETAILED DESCRIPTION OF THE EMBODIMENTS

Figure 1:
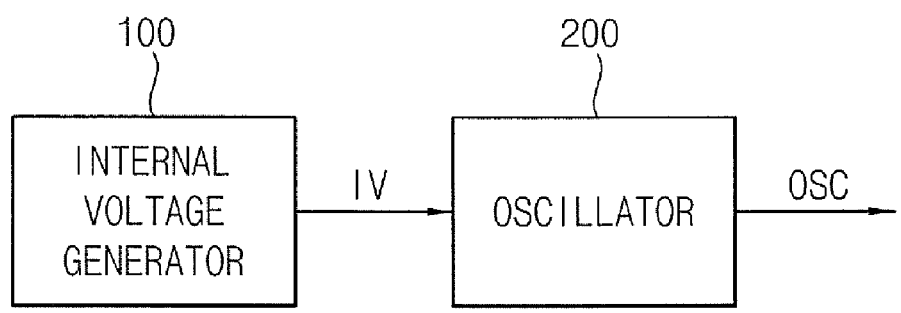
FIG. 1 is a block diagram illustrating an oscillation circuit according to some example embodiments.

Embodiments of some example embodiments now will be described more fully with reference to the accompanying drawings, in which embodiments of some example embodiments are shown. The present inventive concept may, however, be embodied in many different forms and should not be construed as limited to the embodiments set forth herein. Rather, these embodiments are provided so that this disclosure will be thorough and complete, and will fully convey the scope of some example embodiments to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of some example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of some example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which some example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an oscillation circuit according to some example embodiments.

Referring to FIG. 1, the oscillation circuit 10 may include an internal voltage generator 100 and an oscillator 200.

The internal voltage generator 100 generates an internal voltage IV which increases in linearly with an operational temperature, and provides the internal voltage IV to the oscillator 200.

A dynamic random access memory (DRAM) pertaining to volatile memory devices may include a plurality of memory cells, and each of the memory cells may include a transistor and a capacitor. Once data is stored in the corresponding memory cell as a form of a charge on the capacitor, the memory cell may be refreshed after a predetermined time such as a refresh period since the stored charge is gradually decreased over time due to leakage current. As the operational temperature becomes higher, the leakage current may increase, and thus the memory cells may be required to, be refreshed faster. For example, when the operational temperature increases about 10° C., the leakage current may increase twice, and thus the stored charge may be discharged twice times faster. If the refresh period is fixed based on a relatively higher operational temperature condition, unnecessarily-frequent self refresh operations may be performed when the operational temperature decreases.

When the oscillation signal is generated based on an external voltage applied to the oscillator 200, a period of the oscillation signal may be changed according to variations of the external voltage. The internal voltage generator 100 according to some example embodiments generates the internal voltage IV which has a fixed value regardless of the variations of the external voltage, whereas the internal voltage IV may adaptively vary in linearly with the operational temperature. For example, the internal voltage IV increases in proportion to the operational temperature.

The oscillator 200 generates a variable oscillation signal OSC based on the internal voltage IV. As a result, the variable oscillation signal OSC has variable periods according to the operational temperature to perform the effective self refresh operations.

Figure 2:
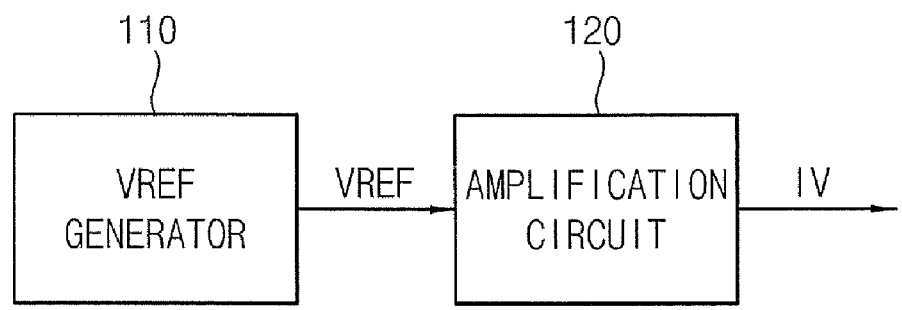
FIG. 2 is a block diagram illustrating an example of an internal voltage generator in the oscillation circuit of FIG. 1.

FIG. 2 is a block diagram illustrating an example of the internal voltage generator in the oscillation circuit of FIG. 1.

Referring to FIG. 2, the internal voltage generator 100 may include a reference voltage generator 110 and an amplification circuit 120.

The reference voltage generator 110 is driven by the external voltage and generates a reference voltage VREF. When the operational temperature is constant, the reference voltage VREF maintains a fixed value even if the external voltage provided to the reference voltage generator 110 changes. When the operational temperature varies, the reference voltage VREF increases or decreases with the operational temperature although the external voltage does not change.

The amplification circuit 120 amplifies the reference voltage VREF to generate the internal voltage IV. The internal voltage IV increases with the reference voltage VREF and has an improved linearity compared with the reference voltage VREF. In other words, when the operational temperature changes, a voltage variation of the internal voltage IV may be greater than a voltage variation of the reference voltage VREF.

Figure 3:
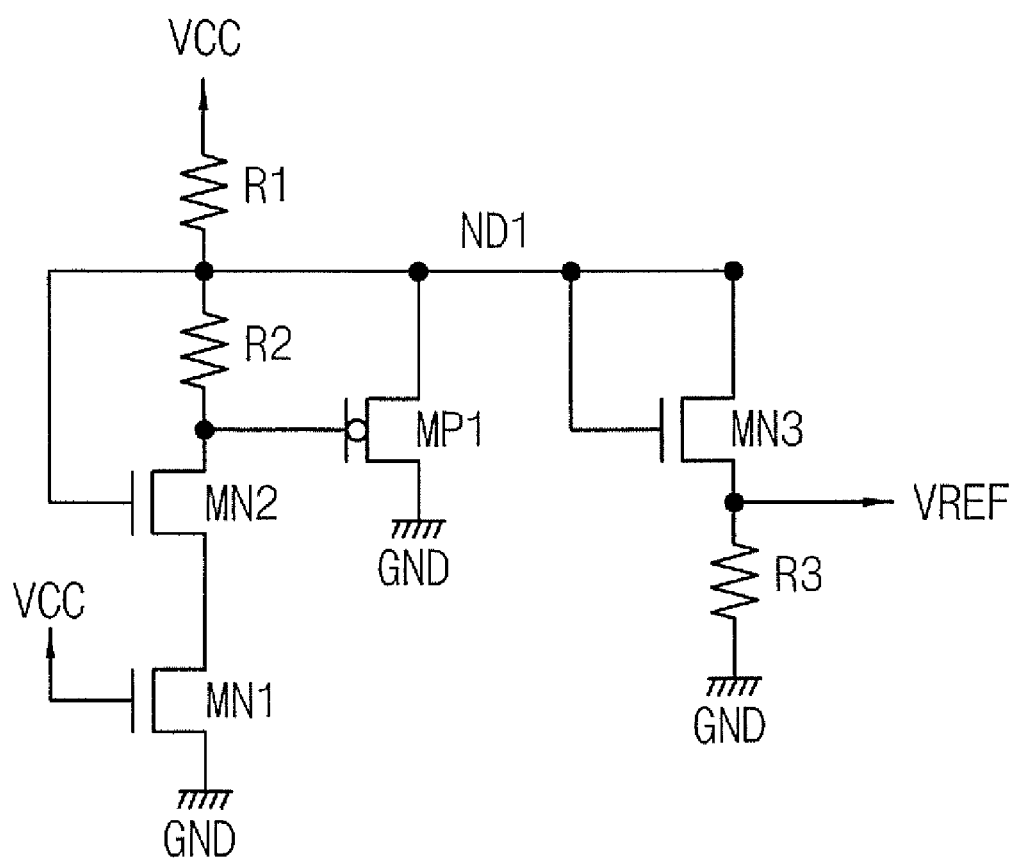
FIG. 3 is a circuit diagram illustrating an example of a reference voltage generator in the internal voltage generator of FIG. 1.

FIG. 3 is a circuit diagram illustrating an example of the reference voltage generator in the internal voltage generator of FIG. 1.

Referring to FIG. 3, the reference voltage generator 110 may include a first n-type metal oxide semiconductor (NMOS) transistor MN1, a second NMOS transistor MN2, a first p-type metal oxide semiconductor (PMOS) transistor MP1, a first resistor R1, a second resistor R2, a third NMOS transistor MN3, and a third resistor R3.

The first NMOS transistor MN1 may include a source connected to a ground voltage GND, a gate for receiving the external voltage VCC, and a drain connected to a source of the second NMOS transistor MN2. The second NMOS transistor MN2 may include the source connected to the drain of the first NMOS transistor MN1, a gate connected to a first node ND1, and a drain connected to a gate of the first PMOS transistor MP1.

The first resistor R1 is connected between the external voltage VCC and the first node ND1, and the second resistor R2 is connected between the first node ND1 and the drain of the second NMOS transistor MN2.

The first PMOS transistor MP1 may include a source connected to the first node ND1, the gate connected to the drain of the second NMOS transistor MN2, and a drain connected to the ground voltage GND. The third NMOS transistor MN3 may include a source connected to the third resistor R3, a gate and a drain commonly connected to the first node ND1. That is, the third NMOS transistor MN3 may be a diode-coupled transistor the gate and drain of which are connected with each other. The third resistor R3 is connected between the ground voltage GND and the source of the third NMOS transistor MN3.

Hereinafter, operations of the reference voltage generator 110 when the operational temperature is fixed will be described.

The first and second NMOS transistors MN1 and MN2 may operate in a triode region due to current-voltage characteristics of transistors, and then the first and second NMOS transistors MN1 and MN2 may operate as linear resistors. When the reference voltage generator 110 does not include the third NMOS transistor MN3, a voltage of the first node ND1 may be represented by Equation 1.

$$VSTB = V_{thp}\left(1 + \frac{R_{MN1} + R_{MN2}}{R2}\right) \quad \text{[Equation 1]}$$

VSTB denotes the voltage of the first node ND1, Vthp denotes a threshold voltage of the first PMOS transistor, RMN1 denotes a resistance of the first NMOS transistor MN1, RMN2 denotes a resistance of the second NMOS transistor MN2, and R2 denotes a resistance of the second resistor R2.

With reference to Equation 1, the voltage of the first node ND1 may have a fixed value regardless of the external voltage VCC. Hereinafter, the voltage of the first node ND1 is referred to as a bias voltage.

Since the third NMOS transistor MN3 is the diode-coupled transistor, the third NMOS transistor MN3 operates in a saturation region. Thus, the third NMOS transistor MN3 transfers a current which maintains fixed value, and finally the reference voltage VREF may have a fixed value based on the bias voltage regardless of the variation of external voltage VCC.

When the operational temperature varies, the threshold voltage of the transistors may vary in inverse proportion to the operational temperature. Therefore, the reference voltage VREF may vary with the threshold voltage of the third NMOS transistor MN3. The diode-coupled transistor may have higher linearity than the typical transistors.

As the operational temperature becomes lower, the threshold voltage of the third NMOS transistor MN3 increases, and thus the reference voltage VREF decreases. As the operational temperature becomes higher, the threshold voltage of the third NMOS transistor MN3 decreases, and thus the reference voltage VREF increases. Therefore, the reference voltage VREF may be generated based on the bias voltage having the fixed value and the threshold voltage of the third NMOS transistor MN3. Therefore, the reference voltage generator 110 generates the reference voltage VREF without an additional temperature sensor. The reference voltage VREF has the fixed value regardless of the external voltage, whereas the reference voltage VREF varies in linearly with the operational temperature.

Figure 4A:
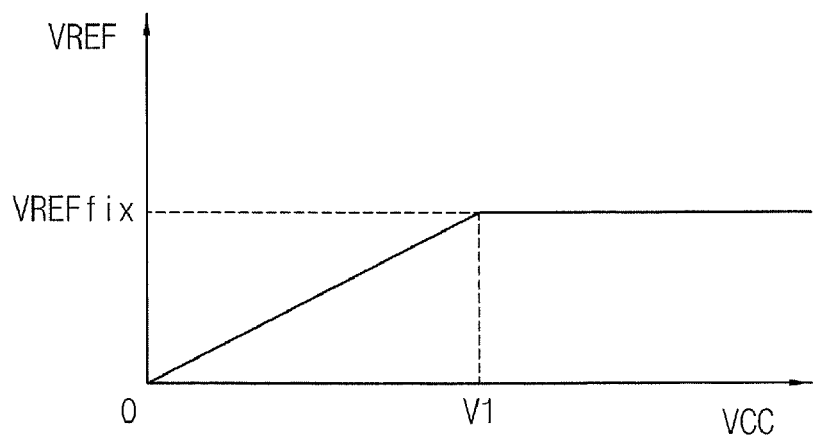
FIG. 4A is a diagram illustrating the reference voltage relative to the external voltage.

FIG. 4A is a diagram illustrating the reference voltage relative to the external voltage.

VCC represents the external voltage and VREF represents the reference voltage generated by the reference voltage generator.

Referring to FIG. 4A, when the external voltage is relatively small, the reference voltage increases in proportion to the external voltage. When the external voltage exceeds a predetermined value V1, the reference voltage maintains the fixed value VREFfix regardless of the external voltage VCC since the first and second NMOS transistor MN1 and MN2 operate as linear resistors.

Figure 4B:
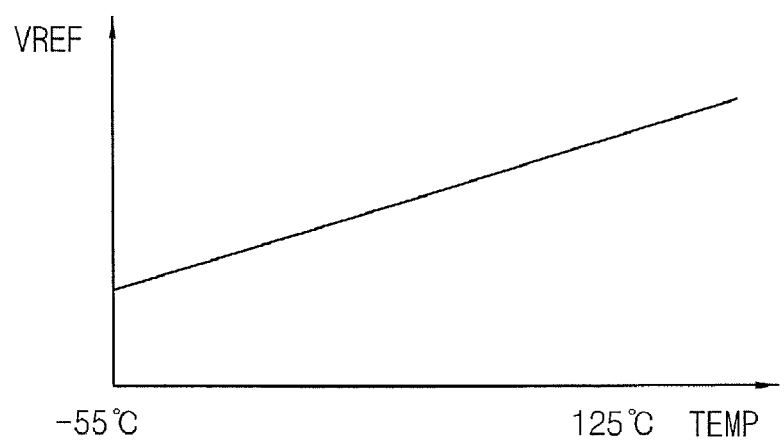
FIG. 4B is a diagram illustrating the reference voltage relative to the temperature.

FIG. 4B is a diagram illustrating the reference voltage relative to the operational temperature.

TEMP represents the operational temperature of the oscillation circuit 10 of FIG. 1.

As described above, since the threshold voltage of the third NMOS transistor MN3 varies with the operational temperature, the reference voltage increases with the operational temperature as illustrated in FIG. 4B.

Figure 5:
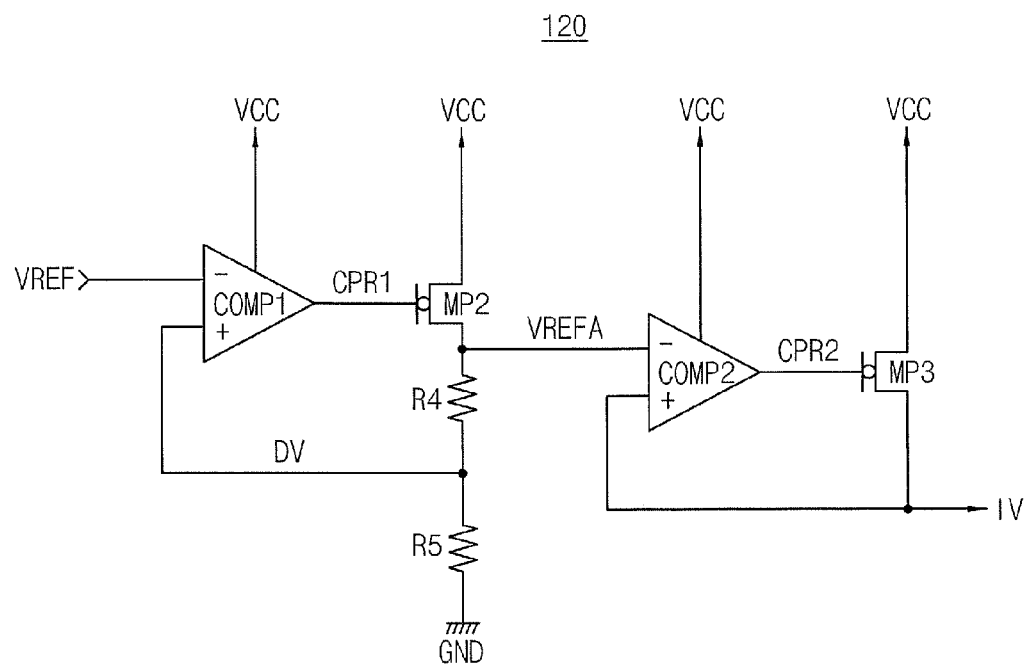
FIG. 5 is a circuit diagram illustrating an example of the amplification circuit in the internal voltage generator of FIG. 2.

FIG. 5 is a circuit diagram illustrating an example of the amplification circuit in the internal voltage generator of FIG. 2.

Referring to FIG. 5, the amplification circuit 120 may include a first comparator COMP1, a second comparator COMP2, a second PMOS transistor MP2, a third PMOS transistor MP3, a fourth resistor R4, and a fifth resistor R5.

The first comparator COMP1 may include an inverting terminal receiving the reference voltage VREF, and a non-inverting terminal connected to a node between the fourth resistor R4 and the fifth resistor R5. The non-inverting terminal receives a divided voltage DV which is obtained by dividing the amplified reference voltage VREF with the fourth and fifth resistors R4 and R5.

The second PMOS transistor MP2 includes a source connected to the fourth resistor R4, a gate connected to an output terminal of the first comparator COMP1 for receiving the first comparison signal CPR1, and a drain receiving the external voltage VCC.

The fourth resistor R4 is connected between the source of the second PMOS transistor MP2 and the fifth resistor R5, and the fifth resistor R5 is connected between the ground voltage GND and the fourth resistor R4.

The divided voltage DV obtained by dividing the amplified reference voltage VREFA with the fourth and fifth resistor R4 and R5 is applied to the non-inverting terminal of the first comparator COMM. The first comparator COMP1 compares the reference voltage VREF and the divided voltage DV to output the first comparison signal CPR1 to the gate of the second PMOS transistor MP2. For example, the first comparator COMP1 outputs the first comparison signal CPR1 corresponding to a logic state "high" when the divided voltage DV is smaller than the reference voltage VREF. The first comparator COMP1 outputs the first comparison signal CPR1 corresponding to a logic state "low" when the divided voltage DV is greater then the reference voltage VREF. The second PMOS transistor MP2 is turned on in response to the first comparison signal CPR1 and transfers the external voltage VCC.

When the divided voltage DV is smaller than the reference voltage VREF, the second PMOS transistor MP2 is turned on in response to the first comparison signal CPR1, and thus the divided voltage DV increases. When the increased divided voltage DV becomes greater than the reference voltage VREF, the second PMOS transistor MP2 is turned off in response to the first comparison signal CPR1. Consequently, the divided voltage DV may correspond to the reference voltage VREF.

The amplified reference voltage VREFA may be determined based on the reference voltage VREF, the fourth resistor R4, and the fifth resistor R5. Because the amplified reference voltage VREFA is greater than the divided voltage DV in a ratio of (R4+R5)/R5 and the divided voltage DV corresponds to the reference voltage VREF, a level of the amplified reference voltage VREFA may correspond to about an (R4+R5)/R5 times amplified level of the reference voltage VREF.

The second comparator COMP2 may include an inverting terminal receiving the amplified reference voltage VREFA and a non-inverting terminal receiving the internal voltage IV. The second comparator COMP2 compares the amplified reference voltage VREFA with the internal voltage IV and provides a second comparison signal CPR2 to a gate of the third PMOS transistor MP3.

When the internal voltage IV is greater than the amplified reference voltage VREFA, the second comparison signal CPR2 may correspond to the logic state "low". When the internal voltage IV is smaller than the amplified reference voltage VREFA, the second comparison signal CPR2 may correspond to the logic state "high".

The third PMOS transistor MP3 is turned on/off in response to the second comparison signal CPR2, and thus the internal voltage IV may corresponds to the amplified reference voltage VREFA.

The amplification circuit 120 receives the reference voltage VREF which increases in linearly with the operational temperature, amplifies the reference voltage VREF to generate the amplified reference voltage, and finally generates the internal voltage IV. The internal voltage IV may have an improved linearity compared with the reference voltage VREF because the internal voltage IV is generated by amplifying the reference voltage VREF.

Figure 6A:
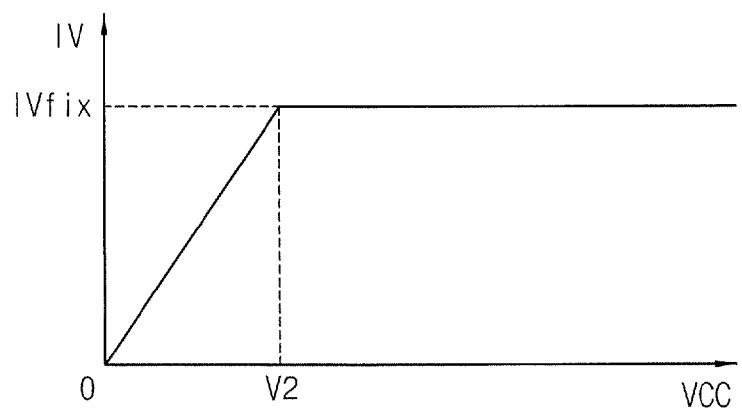
FIG. 6A is a diagram illustrating the internal voltage relative to the external voltage.

FIG. 6A is a diagram illustrating the internal voltage relative to the external voltage.

In similar to the reference voltage VREF illustrated in FIG. 4A, the internal voltage IV maintains a fixed value IVfix when the external voltage VCC exceeds a predetermined value V2. The internal voltage IV may have the fixed value IVfix higher than the fixed value VREFfix of the reference voltage VREF as shown in FIG. 4A. The oscillator 200 may receive the internal voltage IV having the fixed value regardless of the external voltage VCC, and thus the period of the variable oscillation signal OSC generated by the oscillator 200 may not be affected by the external voltage VCC. Because the oscillator 200 generates the variable oscillation signal OSC unaffected by the external voltage VCC, a leakage current due to the external voltage VCC may be reduced.

Figure 6B:
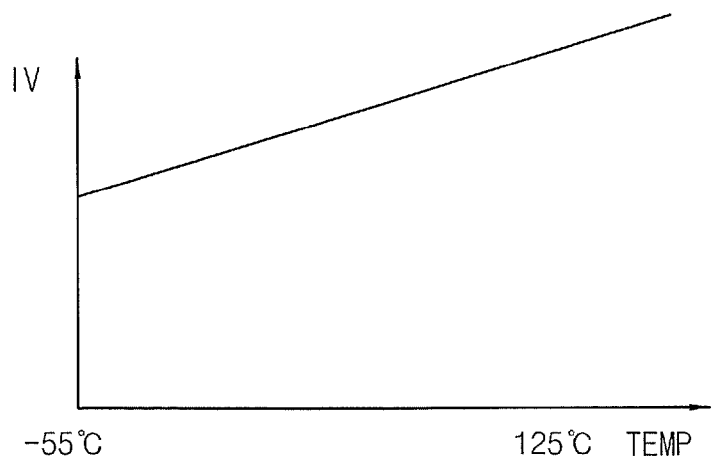
FIG. 6B is a diagram illustrating the internal voltage relative to the temperature.

FIG. 6B is a diagram illustrating the internal voltage relative to the operational temperature.

The internal voltage IV increases with the operational temperature in similar to the reference voltage VREF illustrated in FIG. 4B. The internal voltage IV may be generated by amplifying the reference voltage VREF, the voltage level of the internal voltage IV may be greater than the voltage level of the reference voltage VREF, and thus the internal voltage IV may have improved linearity compared with the reference voltage VREF.

Figure 7A:
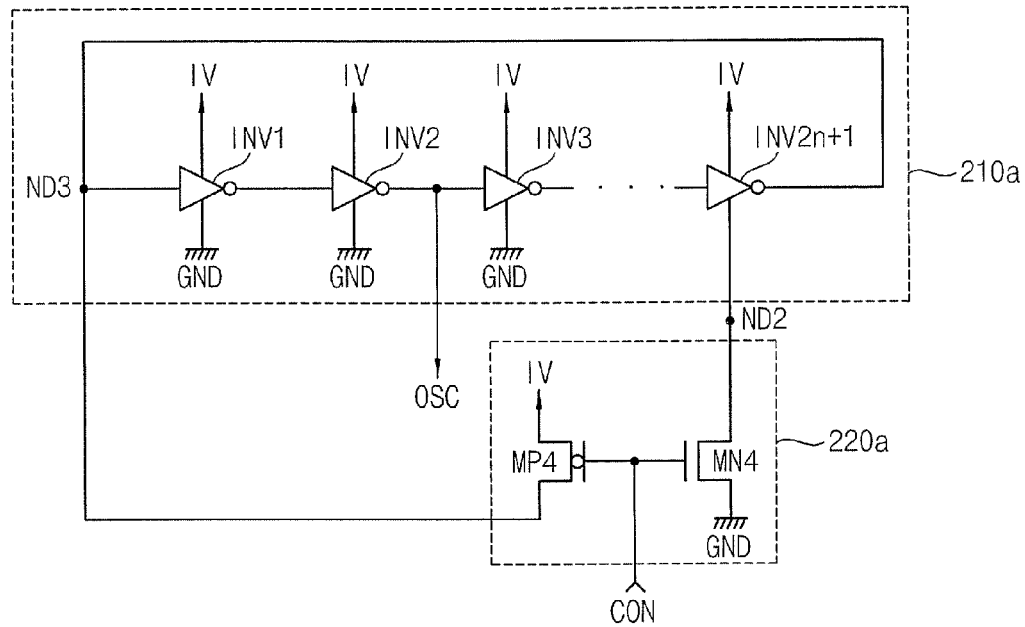
FIG. 7A is a circuit diagram illustrating an example of an oscillator in the oscillation circuit of FIG. 1.

FIG. 7A is a circuit diagram illustrating an example of the oscillator in FIG. 1.

Referring to FIG. 7A, the oscillator 200a may include an oscillation signal generating unit 210a and an oscillation control unit 220a.

The oscillation signal generating unit 210a may include a plurality of inverters INV1, INV2, INV3, . . . , and INV2n+1 which are serially connected with each other. An input terminal of the first inverter INV1 is connected to the output terminal of the last inverter INV2n+1, such that the plurality of inverters forms a ring structure. The plurality of inverters INV1, INV2, INV3, . . . , and INV2n+1 may be an odd number of inverters. The plurality of inverters INV1, INV2, INV3, . . . , and INV2n+1 are connected between the internal voltage IV and the ground voltage GND, and thus they may be driven by the internal voltage IV. The inverters INV1, INV2, INV3, . . . , and INV2n+1 may be implemented with a complementary metal oxide semiconductor (CMOS) transistor including an NMOS transistor and a PMOS transistor.

When the plurality of inverters INV1, INV2, INV3, . . . , and INV2n+1 are driven by the external voltage VCC, currents flowing through the plurality of inverters INV1, INV2, INV3, . . . , and INV2n+1 may have a constant value regardless of the operational temperature when the external voltage VCC maintains a fixed value. Therefore, the variable oscillation signal OSC may have a fixed period although the operational temperature varies.

When the inverters are driven by the internal voltage IV which increases with the operational temperature, effective carrier mobility in channel region of the transistors included in the inverters may be improved, and thus the threshold voltages of the transistors may decrease. Due to the increase of the effective carrier mobility and the decrease of the threshold voltages, the transistor may become more capacitive, and thus delay time of the respective inverters may decrease. Therefore, a frequency of the variable oscillation signal OSC increases with the operational temperature.

In other words, because gate-source voltages of the PMOS transistors included in the plurality of the inverters decrease as the internal voltage IV increases, the internal resistances of the transistors become smaller, and thus operation speeds of the inverters increase.

The variable oscillation signal OSC varies in linearly with the operational temperature, for example, the frequency of the variable oscillation signal OSC increases as the operational temperature becomes higher. Thus, the self refresh operation may be performed more frequently according as the operational temperature increases. The frequency of the variable oscillation signal OSC increase with the operational temperature, and thus the self refresh operation may be performed more frequently.

Referring to FIG. 7A, the oscillation control unit 220a may include a fourth NMOS transistor MN4 and a fourth PMOS transistor MP4.

The fourth NMOS transistor MN4 includes a source connected to the ground voltage GND, a gate receiving the control signal CON, and a drain connected to a second node ND2. The second node ND2 may be connected to the source of one of the plurality of PMOS/NMOS transistors included in the oscillation signal generation unit 210a.

The fourth PMOS transistor MP4 includes a source receiving the internal voltage IV, a gate for receiving the control signal CON, and a drain connected to a third node ND3 corresponding to the input terminal of the plurality of inverters INV1, INV2, INV3, . . . , INV2n+1.

The oscillation control unit 220a controls operations of the oscillation signal generation unit 210a in response to the control signal CON. For example, the oscillation control unit 220a may enable the oscillation signal generation unit 210a in response to the control signal CON.

When the control signal CON corresponds to the logic state "high", the fourth NMOS transistor MN4 may be turned on and the fourth PMOS transistor MP4 may be turned off. The fourth NMOS transistor MN4 sinks currents flowing through the (2n+1)st inverter INV2n+1, the third node ND3 is floated, and thus the variable oscillation signal OSC is not generated.

When the control signal CON corresponds to the logic state "low", the fourth NMOS transistor MN4 may be turned off and the fourth PMOS transistor MP4 may be turned on. The fourth PMOS transistor MP4 provides the internal voltage IV to the oscillation signal generation unit 210a, that is, the third node ND3 is floated, and thus the variable oscillation signal OSC is generated. The variable oscillation signal OSC may be output through arbitrary node of the plurality of inverters INV1, INV2, INV3, INV2n+1.

The oscillation control unit 220a may, alternatively be implemented with the NMOS transistors and the PMOS transistors, and the control signal CON may have different logic state according to some example embodiments.

Figure 7B:
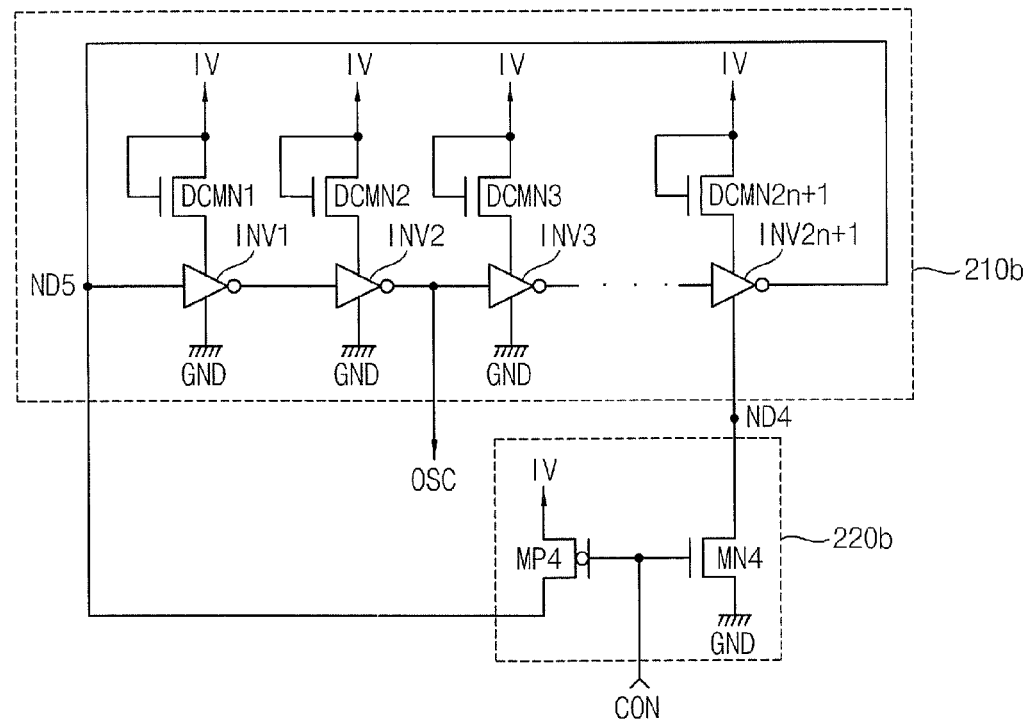
FIG. 7B is a circuit diagram illustrating another example of the oscillator in the oscillation circuit of FIG. 1.

FIG. 7B is a circuit diagram illustrating another example of the oscillator in FIG. 1.

Compared with FIG. 7B, the oscillator 200b further includes an odd number of NMOS transistors DCMN1, DCMN2, DCMN3, DCMN2n+1 connected between the internal voltage IV and the plurality of inverters INV1, INV2, INV3, INV2n+1, particularly, sources/drains of the PMOS/NMOS transistors included in the plurality of inverters INV1, INV2, INV3, INV2n+1. Thus, the oscillation signal generation unit 210b in FIG. 7B includes an odd number of inverters INV1, INV2, INV3, INV2n+1 driven by voltages of sources NMOS transistors DCMN1, DCMN2, DCMN3, DCMN2n+1.

Drains and gates of each of the NMOS transistors DCMN1, DCMN2, DCMN3, DCMN2n+1 are connected with each other such that the NMOS transistors DCMN1, DCMN2, DCMN3, DCMN2n+1 may be the diode-coupled transistor. As mentioned above, the threshold voltage the diode-coupled transistor may decrease with the operational temperature, and thus a drive voltage provided to the plurality of inverters INV1, INV2, INV3, INV2n+1 may have an improved linearity according to the operational temperature compared with the internal voltage IV.

As the operational temperature increases, the internal voltage IV increases and the threshold voltages of the diode-coupled transistors DCMN1, DCMN2, DCMN3, DCMN2n+1 decrease. As the drain voltages of the NMOS transistors DCMN1, DCMN2, DCMN3, DCMN2n+1 become higher, the effective carrier mobility in channel region increases and the internal resistances of the transistors decreases, and thus the internal frequency of the oscillation signal generation unit 210b increases.

As the operational temperature decreases, the internal voltage IV decreases and the threshold voltages of the diode-coupled transistors DCMN1, DCMN2, DCMN3, DCMN2n+1 increase. As the drain voltages of the NMOS transistors DCMN1, DCMN2, DCMN3, DCMN2n+1 become lower, the effective carrier mobility in channel region decreases and the internal resistances of the transistors increases, and thus the internal frequency of the oscillation signal generation unit 210b decreases.

The oscillation circuit 10 includes an internal voltage generator 100 generating the internal voltage IV which increases with the operational temperature and the oscillator 200 generating the variable oscillation signal OSC based on the internal voltage IV so that the self refresh operation may be adaptively performed according to the temperature without the additional temperature sensors.

The oscillation control unit 220b may be implemented in substantially the same structure as the oscillation control circuit 220a in FIG. 7A.

The oscillation control circuit 220b receives the control signal CON through the gates of fourth. PMOS and NMOS transistors connected with each other and controls the oscillation operation of the oscillation signal generation unit 210b. For example, the oscillation signal generation unit 210b may generate the variable oscillation signal OSC in response to the control signal CON.

The fourth PMOS transistor MN4 included in the oscillation control unit 220b may include a source connected to the ground voltage GND, a gate receiving the control signal CON, and a drain connected to a fourth node ND4. The fourth node ND4 may be connected to the source of one of the plurality of PMOS/NMOS transistors included in the oscillation signal generation unit 210b.

The fourth PMOS transistor MP4 includes a source receiving the internal voltage IV, a gate for receiving the control signal CON, and a drain connected to a fifth node ND5 corresponding to the input terminal of the plurality of inverters INV1, INV2, INV3, INV2n+1.

When the control signal CON corresponds to the logic state "high", the fourth NMOS transistor MN4 may be turned on and the fourth PMOS transistor MP4 may be turned off. The fourth NMOS transistor MN4 sinks currents flowing through the (2n+1)st inverter INV2n+1, the fifth node ND5 is floated, and thus the variable oscillation signal OSC is not generated.

When the control signal CON corresponds to the logic state "low", the fourth NMOS transistor MN4 may be turned off and the fourth PMOS transistor MP4 may be turned on. The fourth PMOS transistor MP4 provides the internal voltage IV to the oscillation signal generation unit 210a, that is, the fifth node ND5 is floated, and thus the variable oscillation signal OSC is generated. The variable oscillation signal OSC may be output through arbitrary node of the plurality of inverters INV1, INV2, INV3, INV2n+1.

Figure 8A:
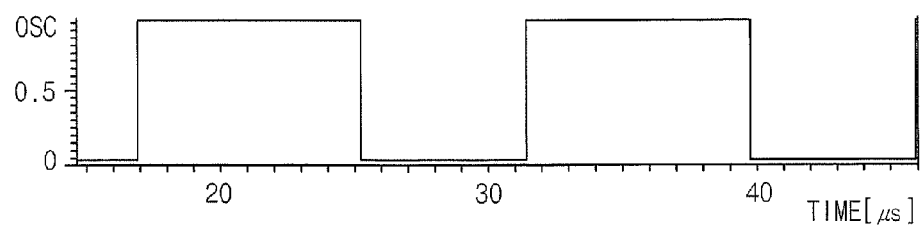
FIGS. 8A, 8B and 8C illustrate waveforms of a variable oscillation signal generated by the oscillator according to some example embodiments.
Figure 8B:
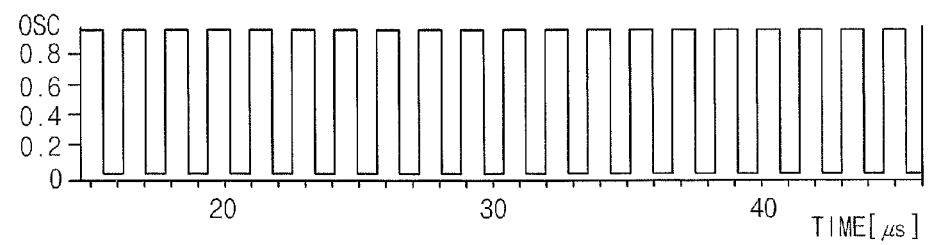
Figure 8C:
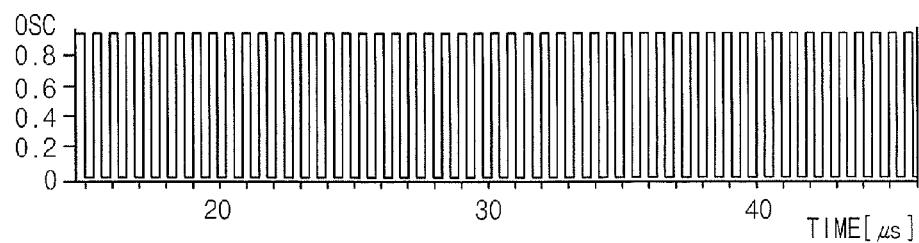

FIGS. 8A, 8B and 8C illustrate waveforms of the variable oscillation signal generated by the oscillator of FIG. 7B according to some example embodiments.

The operational temperature corresponds to about −55° C. in a case of FIG. 8A, about 25° C. in a case of FIG. 8B and about 125° C. in a case of FIG. 8C.

With reference to FIGS. 8A, 8B and 8C, the period of the variable oscillation signal OSC may respectively be about 80 ms in FIG. 8A, about 10 ms in FIG. 8B and about 2 ms in FIG. 8C. Even if the external voltage VCC has a fixed value such as 0.95V, the internal voltage IV may increase with the operational temperature, and thus the variable oscillation signal generated at relatively higher operational temperature such as 125° C. may have approximately 20 times great frequency compared with the variable oscillation signal generated at relatively lower operational temperature such as −55° C.

The oscillation circuit 10 according to some example embodiments generates the variable oscillation signal OSC which adaptively varies periods according to the operational temperature, and thus the power consumption caused by unwanted self refresh operations performed at the lower operational temperature may be reduced and the data retention features may be improved. In addition, because the additional temperature sensor may not be required, the semiconductor memory device including the oscillation circuit according to some example embodiments may be implemented in a small size.

Figures 9, 10:
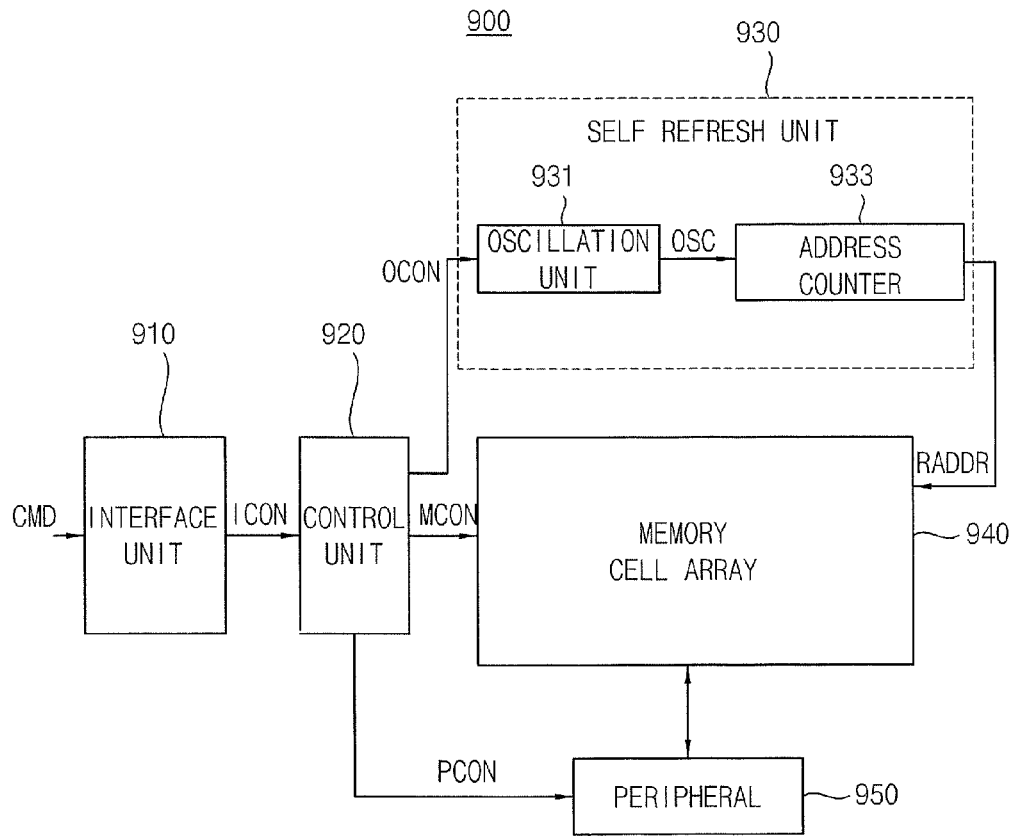
FIG. 9 is a block diagram illustrating a semiconductor memory device including the oscillation circuit according to some example embodiments.
FIG. 10 is a table illustrating currents flowing through the semiconductor memory device according to some example embodiments.

FIG. 9 is a block diagram illustrating a semiconductor memory device including the oscillation circuit according to some example embodiments.

The semiconductor memory device 900 may be implanted with a Pseudo Static Random Access Memory (PSRAM). Cell structures of the PSRAM may be substantially the same as cell structures of the DRAM, whereas operations of the PSRAM may be substantially the same as operations of the SRAM. Each of the memory cells of the PSRAM includes one transistor and one capacitor so that the PSRAM may be referred to as a unit transistor RAM (UtRAM).

The PSRAM is proposed to overcome some problems that may occur during the self refresh operations of the DRAM. As the memory device becomes smaller, the memory cells including the capacitor also become smaller, and thus the charge stored on the capacitor as data may be refreshed faster than before. However, when the self refresh operation is performed on the memory cells, the data may not be accessible and thus the overall operation performance may be degraded. Thus, the PSRAM may perform the reading, writing, and self refresh operations in one period for improving the overall operation performance. The PSRAM may operate as the SRAM as seen from the exterior and has high density feature of the DRAM.

Referring to FIG. 9, the semiconductor memory device 900 may include an interface unit 910, a control unit 920, a self refresh unit 930, and a memory cell array 940.

The interface unit 910 may communicate with an external device such as a host through at least one of a universal serial bus (USB), a multimedia Card (MMC), a Peripheral Component Interconnect-Express (PCI-E), a Serial Advanced Technology Attachment (SATA), a Parallel Advanced Technology Attachment (PATA), a small computer system interface (SCSI), an enhanced small device interface (ESDI), an integrated drive electronics (IDE) and so on.

The interface unit 910 receives command signal CMD including a data address, data, a mode selecting signal and so on from the external device. The interface unit 910 converts the command signal CMD to a signal which has an appropriate signal formation for an internal circuit of the semiconductor memory device 900, and to provide the control unit 920 as an internal control signal ICON.

The control unit 920 receives the internal control signal ICON and controls whole operations of the semiconductor memory device 900. The control unit 920 provides a memory cell control signal MCON to the memory cell array 940 to write the data to the memory cells or to read written data from the memory cells.

The control unit 920 outputs an oscillation control signal OCON to control the self refresh unit 930. The self refresh unit 930 may include an oscillation unit 931 and an address counter 933.

The oscillation unit 931 generates the variable oscillation signal OSC based on the oscillation control signal OCON. The oscillation control signal OCON may select a temperature compensation mode or a normal mode. In the temperature compensation mode, the variable oscillation signal OSC may have variable period according to the operational temperature, for example, the period of the variable oscillation signal OSC may decrease as the operational temperature becomes higher. In the normal operation, the variable oscillation signal OSC may have the fixed frequency regardless of the operational temperature.

The address counter 933 receives the variable oscillation signal OSC to sequentially provide a refresh address RADDR indicating memory cells to be refreshed, and counts an oscillation number of the variable oscillation signal OSC to determine whether the self refresh operation is completed. For example, the address counter 933 may determine that the self refresh operation is completed when the counted number of the oscillation number of the variable oscillation signal OSC is equal to a number of rows of the memory cell array 940. The refresh address RADDR may be provided to the memory cell array 940 with sequentially increasing so that the memory cell array 940 is refreshed row by row.

The memory cells included in the memory cell array 940 may store or provide data based on a memory control signal MCON. The memory cell array 940 may include a row decoder, a column decode, and a latch circuit. The memory cell array 940 may be implemented with a transistor and a capacitor as mentioned above.

In a standby condition, the memory cell array 940 may regularly perform the self refresh operation on the memory cell array 940 to prevent a loss of the data which are stored by recharging the capacitor of the memory cell. In the self refresh operation, the refresh address RADDR may be provided to the memory cell array 940, the stored data may be detected, and then the detected data may be stored again through the corresponding bit lines. As the memory device becomes smaller and the memory device is implemented as a system on a chip (SoC), the volatile semiconductor memory device such as PSRAM and DRAM may be preferred to consume small amount of currents in the standby condition to improve operational performances.

The semiconductor memory device 900 may further include peripheral circuits 950. The peripheral circuits 950 may temporarily store the data from the memory cell array 940 or receive data will be written to the memory cell 940 from the control unit 920. The peripheral circuits 950 may include a RAM and an SRAM.

FIG. 10 is a table illustrating currents flowing through the semiconductor memory device according to some example embodiments.

Referring to FIG. 10, operating current1 represents a current flowing through the semiconductor memory in a case where the variable oscillation signal OSC having a period of 6 ns is generated. When the variable oscillation signal OSC has a fixed period of 6 ns, the operating current1 corresponding to 20 mA may flow through the semiconductor memory device according to some example embodiments.

Because the variable oscillation signal OSC generated by the oscillator 200b of FIG. 7B may have the various periods as illustrated in FIGS. 8A, 8B and 8C, a currents flowing through the semiconductor memory device including the oscillator 200b of FIG. 7B may be referred to as operating current2. The operating current2 in a case where the operation temperature corresponds to about −55° C. may correspond to about 6.144 µA, the operating current2 in a case where the operation temperature corresponds to about 25° C. may correspond to about 49.152 µA, and the operating current2 in a case where the operation temperature corresponds to about 125° C. may correspond to about 122.88 µA. Thus, the operating current2 under the operational temperature of about 125° C. may be greater about 20 times as much as the operating current2 under the operational temperature of about −55° C., and may be greater about 2.5 times as much as the operating current2 under a normal temperature condition of about 25° C.

The conventional oscillation circuit for the self refresh operation may be set appropriate for the relatively higher temperature condition to prevent the data retention failure. However, oscillation circuit according to some example embodiments may adaptively varies the period of the variable oscillation signal OSC to reduce the power consumption caused by the refresh period having the fixed value regardless of the operational temperature.

A standby current represents a current which flow through the semiconductor memory device 900 and a value described in a parenthesis represents a current which flow through the oscillation circuit 10 during the standby condition.

When the operational temperature corresponds to about −55° C., the standby current of the semiconductor memory device 900 may correspond to about 40 µA and the standby current of the oscillation circuit 10 may correspond to about 12 µA. When the operational temperature corresponds to about 25° C., the standby current of the semiconductor memory device 900 may correspond to about 50 µA and the standby current of the oscillation circuit 10 may correspond to about 15 µA. When the operational temperature corresponds to about 125° C., the standby current of the semiconductor memory device 900 may correspond to about 70 µA and the standby current of the oscillation circuit 10 may correspond to about 20 µA.

When the semiconductor device 900 generates the variable oscillation signal OSC adequate for the relatively higher temperature condition, the over self refresh operation may be performed in a relatively lower temperature condition, and thus the power consumption may increase about 20~30% greater than the semiconductor memory device 900 according to some example embodiments.

A self refresh current represents a current value obtained by adding the operating current2 and the standby current. Because the conventional semiconductor memory device included in the SoC may be required to operate with about 100 µA, the self refresh current flow under the normal condition may correspond to 99.162 µA so that the semiconductor memory device 900 according to some example embodiments may be applicable to the SoC. In the case of the operational temperature of about −55° C., the self refresh operation may be coarsely performed compared with the normal temperature condition, and thus the self refresh current may correspond to about 46.144 µA. Alternatively, in the case of the operational temperature of about 125° C., the self refresh operation may be finely performed compared with the normal temperature condition, and thus the self refresh current may correspond to about 192.88 µA.

The semiconductor memory device 900 according to some example embodiments may be mounted on various packages. The package may include functional blocks according to the system and/or peripheral devices as well as a flash memory device and a memory controller. For example, the package may include a PoP (Package on Package), Ball grid arrays (BGAs), Chip scale packages (CSPs), a Plastic Leaded Chip Carrier (PLCC), a Plastic Dual In-Line Package (PDIP), a Die in Waffle Pack, a Die in Wafer Form, a Chip On Board (COB), a Ceramic Dual In-Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP) and so on.

Figure 11:
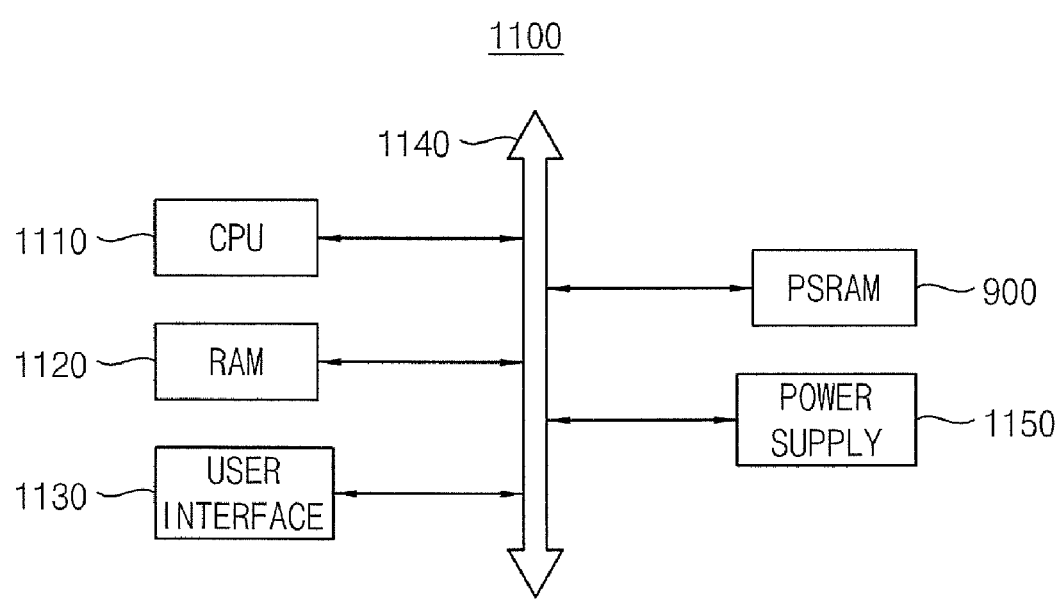
FIG. 11 illustrates a computing system including the semiconductor memory device according to some example embodiments.

FIG. 11 illustrates a computing system including the semiconductor memory device according to some example embodiments.

Referring to FIG. 11, the computing system 1100 may include a central processing unit 1110, a storage device 1120, a user interface unit 1130, a data bus 1140, and the semiconductor memory device 900.

The central processing unit 1110 controls operations of the computing system 1100 through the data bus 1140.

The storage device 1120 stores data from the central processing unit 1110 and outputs the stored data to the central processing unit 1110. The storage device 1120 may be implemented with the memory device such as a high-speed SRAM.

The user interface unit 1130 performs an interfacing operation on signals by converting the signals and providing the converted signals to output circuits such as a monitor, a printer and so on.

The semiconductor memory device 900 may be implemented as a memory card, or may be included in a solid state drive/disk (SSD). The semiconductor memory device 900 may include the interface unit, the control unit, the self refresh unit, the memory cell array, and the peripheral circuits as illustrated in FIG. 9. The semiconductor memory device 900 may reduce the power consumption by generating the variable oscillation signal OSC the frequency of which adaptively increases with the operational temperature. Because the semiconductor memory device according to some example embodiments may have structures of the volatile memory devices, the semiconductor memory device may be implemented as a small-sized compared with the non-volatile memory device. In addition, the semiconductor memory device according to some example embodiments may have merits of the non-volatile memory devices.

The computing system 1100 may further include a power supply 1150 for providing operational voltages to the computing system 1100 when the computing system is included in a mobile device such as a cellular phone, a personal data assistant (PDA), a digital camera, an MP3 player and so on. The computing system 1100 may include an application chip set, a camera image processor (CIS), a mobile DRAM (MDRAM) according to applications to be applied.

While the example embodiments of some example embodiments and their advantages have been described in detail, it should be understood that various changes, substitutions and alternations may be made without departing from the scope of some example embodiments.

What is claimed is:

1. An integrated circuit device, comprising:
   a voltage generator configured to generate a first voltage having a magnitude that varies linearly across a first voltage range in response to changes in an operating temperature of said voltage generator, said voltage generator further comprising a reference voltage generator configured to generate a reference voltage and a bias voltage having a magnitude that is fixed relative to the changes in the operating temperature; and
   an oscillator configured to generate a periodic signal having a frequency that varies linearly across a first frequency range in response to changes in the first voltage.

2. The device of claim 1, wherein said voltage generator comprises:
   an amplifier configured to generate the first voltage in response to the reference voltage having a magnitude that varies linearly across a second voltage range in response to the changes in the operating temperature.

3. The device of claim 2, wherein the first and second voltage ranges are unequal.

4. The device of claim 1, wherein said reference voltage generator is configured to vary the magnitude of the reference voltage relative to the bias voltage.

5. An integrated circuit memory device, comprising:
   an array of memory cells;
   a self-refresh control circuit configured to refresh memory cells in said array at a refresh frequency that varies across a first frequency range in response to changes in an operating temperature of said array, said self-refresh control circuit further configured to generate a refresh address having a value that changes at the refresh frequency; and
   a reference voltage generator configured to generate a reference voltage and a bias voltage having a magnitude that is fixed relative to the changes in the operating temperature.

6. An integrated circuit memory device, comprising:
   an array of memory cells; and
   a self-refresh control circuit configured to refresh memory cells in said array at a refresh frequency that varies across a first frequency range in response to changes in an operating temperature of said array, said self-refresh control circuit comprising:
      a voltage generator configured to generate a first voltage having a magnitude that varies linearly across a first voltage range in response to the changes in the operating temperature, said voltage generator further comprising a reference voltage generator configured to generate a reference voltage and a bias voltage having a magnitude that is fixed relative to the changes in the operating temperature; and
      an oscillator responsive to the first voltage, said oscillator configured to generate a periodic signal having a frequency that varies linearly across a first frequency range in response to the changes in the operating temperature.

7. The memory device of claim 6, wherein said voltage generator comprises:
   an amplifier configured to generate the first voltage in response to the reference voltage having a magnitude that varies linearly across a second voltage range in response to the changes in the operating temperature.

8. The memory device of claim 7, wherein the first and second voltage ranges are unequal.

9. An oscillation circuit, comprising:
   an internal voltage generator configured to receive an external voltage and generate an internal voltage based on the external voltage, the internal voltage varying in linearly with an operational temperature; and
   an oscillator configured to generate a variable oscillation signal based on the internal voltage, a period of the variable oscillation signal varying in linearly with the operational temperature;

wherein the internal voltage generator comprises:
  a reference voltage generator configured to generate a reference voltage based on the external voltage, the reference voltage varying in linearly with the operational temperature; and
  an amplification circuit configured to amplify the reference voltage to generate the internal voltage; and
wherein the reference voltage generator is configured to generate a bias voltage which has a fixed value regardless of the operational temperature, and configured to generate the reference voltage based on the bias voltage.

10. The oscillation circuit of claim 9, wherein the reference voltage generator is configured to generate a bias voltage which has a fixed value regardless of the operational temperature, and configured to generate the reference voltage based on the bias voltage.

11. The oscillation circuit of claim 9, wherein the reference voltage generator comprises:
  a first n-type metal oxide semiconductor (NMOS) transistor including a gate receiving the external voltage and a source connected to a ground voltage;
  a second NMOS transistor including a gate connected to a first node to which the bias voltage applied and a source connected to a drain of the first NMOS transistor;
  a first resistor connected between the external voltage and the first node;
  a second resistor connected between the first node and a drain of the second NMOS transistor;
  a p-type metal oxide semiconductor (PMOS) transistor including a gate connected to the drain of the second NMOS transistor, a source connected to the ground voltage, and a drain connected to the first node;
  a third NMOS transistor including a gate and a drain connected to the first node in common; and
  a third resistor connected between the ground voltage and a source of the third NMOS transistor,
  wherein the reference voltage corresponds to a voltage of the source of the third NMOS transistor.

12. The oscillation circuit of claim 9, wherein the oscillator is a ring oscillator driven by the internal voltage.

13. The oscillation circuit of claim 9, wherein the oscillator comprises:
  an odd number of NMOS transistors respectively including a gate and a drain receiving the internal voltage, the gate and the drain being connected with each other; and
  a ring oscillator including odd number of inverters coupled in series, the inverters respectively being connected between sources of the NMOS transistors and a ground voltage.

14. A semiconductor memory device, comprising:
an interface unit configured to convert a command signal to an internal control signal;
a control unit configured to generate an oscillation control signal and a memory control signal based on the internal control signal;
a self refresh unit configured to generate an internal voltage in response to the oscillation control signal, the internal voltage varying in linearly with an operational temperature, configured to generate a variable oscillation signal based on the internal voltage, and configured to provide a refresh address and a refresh control signal based on the variable oscillation signal; and
a memory cell array including a plurality of memory cells refreshed based on the memory control signal, the refresh address, and the refresh control signal;
wherein the self refresh unit comprises:
  a reference voltage generator configured to generate a reference voltage based on an external voltage, the reference voltage varying in linearly with the operational temperature;
  an amplification circuit configured to amplify the reference voltage to generate the internal voltage; and
  an oscillator configured to generate a variable oscillation signal based on the internal voltage, a period of the variable oscillation signal varying in linearly with the operational temperature;
wherein the reference voltage generator is configured to generate a bias voltage having a fixed value regardless of the external voltage, and configured to generate the reference voltage based on the bias voltage.

* * * * *